(12) United States Patent
Takimoto et al.

(10) Patent No.: US 12,035,484 B2
(45) Date of Patent: Jul. 9, 2024

(54) WIRING CIRCUIT BOARD

(71) Applicant: NITTO DENKO CORPORATION, Osaka (JP)

(72) Inventors: Kenya Takimoto, Osaka (JP); Naoki Shibata, Osaka (JP); Hayato Takakura, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 291 days.

(21) Appl. No.: 17/610,060

(22) PCT Filed: Mar. 31, 2020

(86) PCT No.: PCT/JP2020/014757
§ 371 (c)(1),
(2) Date: Nov. 9, 2021

(87) PCT Pub. No.: WO2020/230470
PCT Pub. Date: Nov. 19, 2020

(65) Prior Publication Data
US 2022/0201871 A1    Jun. 23, 2022

(30) Foreign Application Priority Data
May 16, 2019  (JP) ................................. 2019-092724

(51) Int. Cl.
*H05K 3/44*      (2006.01)
*H05K 1/11*      (2006.01)

(52) U.S. Cl.
CPC ............. *H05K 3/445* (2013.01); *H05K 1/115* (2013.01); *H05K 2201/09563* (2013.01); *H05K 2203/0323* (2013.01); *H05K 2203/0723* (2013.01)

(58) Field of Classification Search
CPC .................. H05K 3/445; H05K 1/115; H05K 2201/09563; H05K 2203/0323
See application file for complete search history.

(56) References Cited

U.S. PATENT DOCUMENTS 8,664,538 B2    3/2014   Kim
9,786,898 B2   10/2017   Heo
(Continued)

FOREIGN PATENT DOCUMENTS

CN     104009725 A    8/2014
JP     2005-100488 A  4/2005
(Continued)

OTHER PUBLICATIONS

International Search Report Issued in PCT/JP2020/014757 on Jun. 30, 2020.
(Continued)

*Primary Examiner* — Sherman Ng
(74) *Attorney, Agent, or Firm* — Edwards Neils LLC; Jean C. Edwards, Esq.

(57) ABSTRACT

A wiring circuit board includes a metal support layer, a base insulating layer disposed on one side in a thickness direction of the metal support layer, and a conductive layer disposed on one side in the thickness direction of the base insulating layer, and including a first terminal and a ground lead residual portion electrically connected to the first terminal. The base insulating layer has a through hole penetrating in the thickness direction. The ground lead residual portion has an opening continuous so as to surround the through hole.

3 Claims, 8 Drawing Sheets

(56) References Cited

U.S. PATENT DOCUMENTS

| | | |
|---|---|---|
| 2004/0238211 A1 | 12/2004 | Momokawa et al. |
| 2005/0061542 A1 | 3/2005 | Aonuma et al. |
| 2007/0074899 A1* | 4/2007 | Aonuma .................. H05K 3/44 |
| | | 174/260 |
| 2009/0255717 A1 | 10/2009 | Mizushima et al. |
| 2009/0261060 A1 | 10/2009 | Mizushima et al. |
| 2009/0283314 A1 | 11/2009 | Ohsawa et al. |
| 2012/0124829 A1* | 5/2012 | Kamei .................. H05K 3/421 |
| | | 29/846 |
| 2014/0126169 A1 | 5/2014 | Ihara et al. |
| 2014/0239422 A1 | 8/2014 | Aoki |

FOREIGN PATENT DOCUMENTS

| | | |
|---|---|---|
| JP | 2007-058967 A | 3/2007 |
| JP | 2009-259315 A | 11/2009 |
| JP | 2009-259357 A | 11/2009 |
| JP | 2009-277861 A | 11/2009 |
| JP | 2010-171040 A | 8/2010 |
| JP | 2011-170948 A | 9/2011 |
| JP | 2013-037727 A | 2/2013 |
| JP | 2013-206488 A | 10/2013 |
| JP | 2014-096423 A | 5/2014 |
| TW | 589732 B | 6/2004 |

OTHER PUBLICATIONS

Written Opinion Issued in PCT/JP2020/014757 on Jun. 30, 2020.
International Preliminary Report on Patentability issued by WIPO on Nov. 16, 2021, in connection with International Patent Application No. PCT/JP2020/014757.
Notice of Reasons for Refusal issued on Dec. 12, 2023, by the Taiwanese Intellectual Property Office in connection with Taiwanese Patent Application No. 109115377.

* cited by examiner

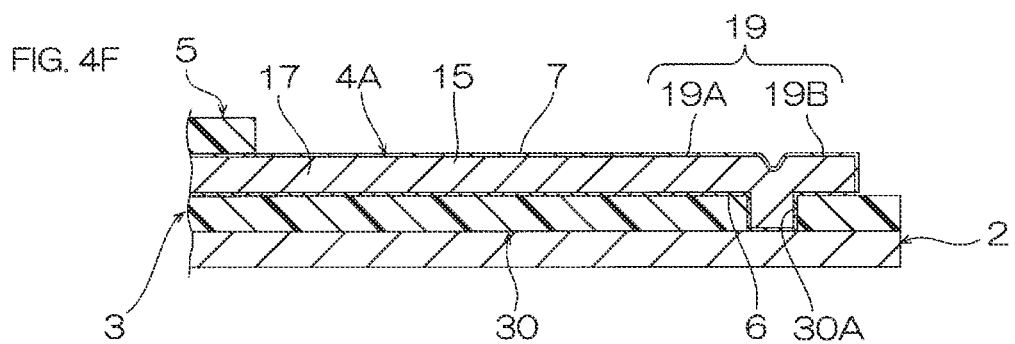
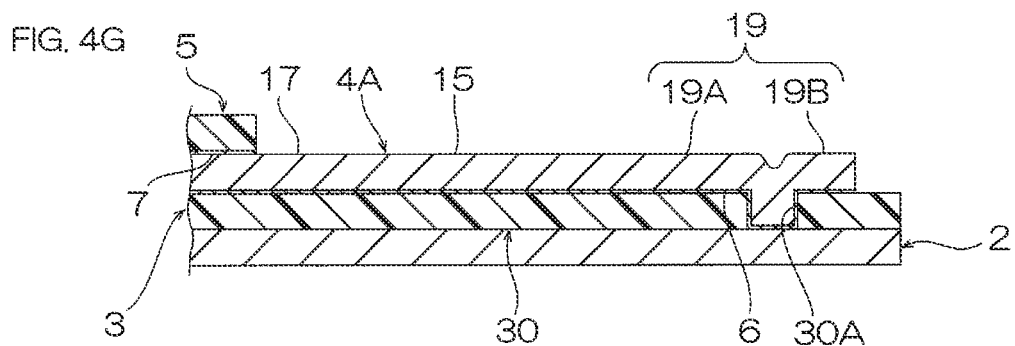
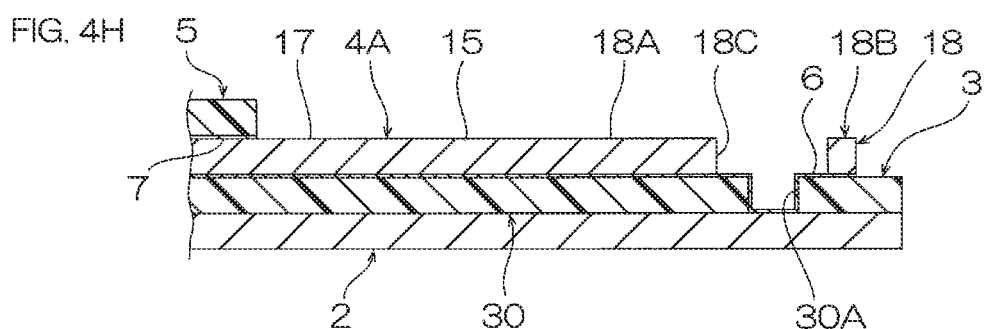
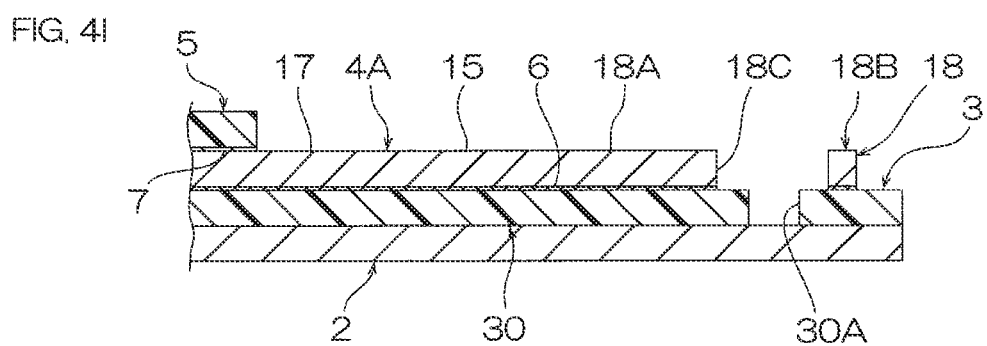
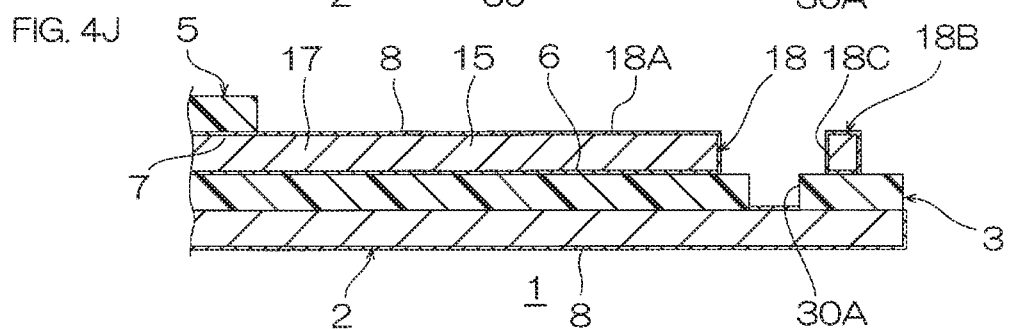

WIRING CIRCUIT BOARD

CROSS-REFERENCE TO RELATED APPLICATIONS

The present application is a 35 U.S.C. 371 National Stage Entry of PCT/JP2020/014757, filed on Mar. 31, 2020, which claims priority from Japanese Patent Application No. 2019-092724, filed on May 16, 2019, the contents of all of which are herein incorporated by reference in their entirety.

TECHNICAL FIELD

The present invention relates to a wiring circuit board.

BACKGROUND ART

Conventionally, a wiring circuit board has been known including a metal support board, a base insulating layer disposed on the metal support board, and a conductive layer disposed on the base insulating layer, and in which the conductive layer includes a wiring circuit pattern for electrically connecting two terminals, and a ground pattern for electrically connecting the terminal to the metal support board.

In such a wiring circuit board, there is a case of forming an electroless plating layer on the surface of the conductive layer. However, a deposition rate of the electroless plating on the wiring circuit pattern, and a deposition rate of the electroless plating on the ground pattern are different due to the presence or absence of electrical connection between the patterns and the metal support board, and it is difficult to form a uniform electroless plating layer on the conductive layer.

Therefore, in the production of the wiring circuit board, it is considered that the conductive layer is subjected to electroless plating in a state of electrically connecting the wiring circuit pattern to the metal support board, and then, the electrical connection between the wiring circuit pattern and the metal support board is cut.

For example, a method for producing a wiring circuit board has been proposed in which after forming a base insulating layer having a second opening portion on the metal support board, a metal thin film is formed on the base insulating layer and the metal support board which is exposed in the second opening portion; subsequently, a wiring circuit pattern is formed on the metal thin film to subject the wiring circuit pattern to electroless plating; and a first opening portion surrounding the second opening portion is formed in the metal support board to cut the electrical connection between the wiring circuit pattern and the metal support board (ref: for example, Patent Document 1).

CITATION LIST

Patent Document

Patent Document 1: Japanese Unexamined Patent Publication No. 2005-100488

SUMMARY OF THE INVENTION

Problem to be Solved by the Invention

However, in the method for producing a suspension board with a circuit described in Patent Document 1, since a first opening portion is formed in the metal support board, and the electrical connection between the wiring circuit pattern and the metal support board is cut, there is a problem that the strength of the suspension board with a circuit decreases.

The present invention provides a wiring circuit board capable of suppressing a decrease in the strength, while capable of forming a uniform electroless plating layer on the conductive layer, and a method for producing a wiring circuit board having excellent production efficiency.

Means for Solving the Problem

The present invention [1] includes a wiring circuit board including a metal support layer, an insulating layer disposed on one side in a thickness direction of the metal support layer, and a conductive layer disposed on one side in the thickness direction of the insulating layer, and including a terminal portion and a ground lead residual portion electrically connected to the terminal portion, wherein the insulating layer has a through hole penetrating in the thickness direction, and the ground lead residual portion has an opening continuous so as to surround the through hole.

However, in the production of the wiring circuit board, the ground lead residual portion is formed by removing a portion of a ground lead for electrically connecting the terminal portion to the metal support layer. Therefore, before the ground lead is removed, since the terminal portion is electrically connected to the metal support layer, it is possible to uniformly form an electroless plating layer on the conductive layer.

Further, according to the above-described configuration, the ground lead residual portion has the opening continuous so as to surround the through hole in the insulating layer. Therefore, it is possible to insulate the ground lead residual portion from the metal support layer without forming an opening in the metal support layer, and it is possible to suppress a decrease in the strength of the wiring circuit board.

The present invention [2] includes the wiring circuit board described in the above-described [1], wherein the opening communicates with the through hole.

According to such a configuration, since the opening of the ground lead residual portion communicates with the through hole in the insulating layer, it is possible to reliably insulate the ground lead residual portion from the metal support layer.

The present invention [3] includes the wiring circuit board described in the above-described [1], wherein the ground lead residual portion includes a via portion disposed in the opening and filling the through hole, and a peripheral end portion defining the opening and located at spaced intervals to the via portion.

According to such a configuration, since the peripheral end portion of the ground lead residual portion is located at spaced intervals to the via portion filling the through hole, it is possible to reliably insulate the ground lead residual portion from the metal support layer.

The present invention [4] includes a method for producing a wiring circuit board including the steps of preparing a metal support layer, forming an insulating layer having a through hole penetrating in a thickness direction on one side in the thickness direction of the metal support layer, forming a conductive layer including a terminal portion disposed on one side in the thickness direction of the insulating layer, and a ground lead for electrically connecting the terminal portion to the metal support layer, subjecting the conductive layer to electroless plating, and removing a portion of the ground lead so as to insulate the terminal portion from the metal support layer to form a ground lead residual portion, wherein the ground lead residual portion has an opening continuous so as to surround the through hole.

According to such a method, after forming the insulating layer having the through hole, the conductive layer including the terminal portion, and the ground lead for electrically connecting the terminal portion to the metal support layer is formed, next, the conductive layer is subjected to electroless plating, and then, a portion of the ground lead is removed so as to insulate the terminal portion from the metal support layer to form the ground lead residual portion.

That is, when the conductive layer is subjected to electroless plating, since the ground lead electrically connects the terminal portion to the metal support layer, it is possible to form a uniform electroless plating layer on the conductive layer.

Further, since the ground lead residual portion formed by removing a portion of the ground lead has the opening continuous so as to surround the through hole, it is possible to insulate the ground lead residual portion from the metal support layer without forming an opening in the metal support layer. Thus, it is possible to suppress a decrease in the strength of the wiring circuit board.

The present invention [5] includes the method for producing a wiring circuit board described in the above-described [4], wherein in the step of removing a portion of the ground lead, the opening communicates with the through hole.

According to such a method, since the opening in the ground lead residual portion communicates with the through hole, it is possible to reliably insulate the ground lead residual portion from the metal support layer.

The present invention [6] includes the method for producing a wiring circuit board described in the above-described [4], wherein in the step of removing a portion of the ground lead, a via portion disposed in the opening and filling the through hole, and a peripheral end portion defining the opening and located at spaced intervals to the via portion are formed.

According to such a method, since the peripheral end portion of the ground lead residual portion is formed at spaced intervals to the via portion filling the through hole, it is possible to reliably insulate the ground lead residual portion from the metal support layer.

The present invention [7] includes the method for producing a wiring circuit board described in any one of the above-described [4] to [6] further including after the step of forming the insulating layer, and before the step of forming the conductive layer, a step of forming a seed film on one surface in the thickness direction of the insulating layer and on one surface in the thickness direction of the metal support layer exposed from the insulating layer; after the step of forming the conductive layer, and before the step of carrying out the electroless plating, a step of removing the seed film exposed from the conductive layer; and after the step of removing a portion of the ground lead, a step of removing the seed film exposed by the removal of the ground lead.

According to such a method, after forming the seed film on the insulating layer and on the metal support layer exposed from the insulating layer, the conductive layer is formed on the seed film, followed by subjecting the conductive layer to electroless plating to form the ground lead residual portion by removing a portion of the ground lead, and then, the seed film exposed by the removal of the ground lead is removed.

However, when the seed film exposed by the removal of the ground lead remains, there is a possibility that the ground lead residual portion is electrically connected to the metal support layer via the seed film. On the other hand, according to the above-described method, since the seed film which is exposed by the removal of the ground lead is removed, it is possible to more reliably insulate the ground lead residual portion from the metal support layer.

Effect of the Invention

According to the wiring circuit board of the present invention, it is possible to suppress a decrease in the strength, while forming a uniform electroless plating layer on a conductive layer.

Further, according to the method for producing a wiring circuit board of the present invention, it is possible to efficiently produce the above-described wiring circuit board.

BRIEF DESCRIPTION OF THE DRAWINGS

FIG. 3A illustrating a step of preparing a metal support layer,

FIG. 3B illustrating a step of forming a base insulating layer,

FIG. 3C illustrating a step of forming a seed film.

FIG. 3D illustrating a step of forming a conductive layer, and

FIG. 3E illustrating a step of forming a first plating layer.

FIGS. 4F to 4J show production process views of the wiring circuit board subsequent to FIG. 3E:

FIG. 4F illustrating a step of forming a cover insulating layer,

FIG. 4G illustrating a step of removing a first plating layer exposed from a cover insulating layer, FIG. 4H illustrating a step of forming a ground lead residual portion, FIG. 4I illustrating a step of removing a seed film exposed by the formation of the ground lead residual portion, and FIG. 4J illustrating a step of forming a second plating layer.

DESCRIPTION OF EMBODIMENTS

First Embodiment

1. Wiring Circuit Board

A wiring circuit board 1 as a first embodiment of a wiring circuit board of the present invention is described with reference to FIGS. 1 and 2.

Figure 1:
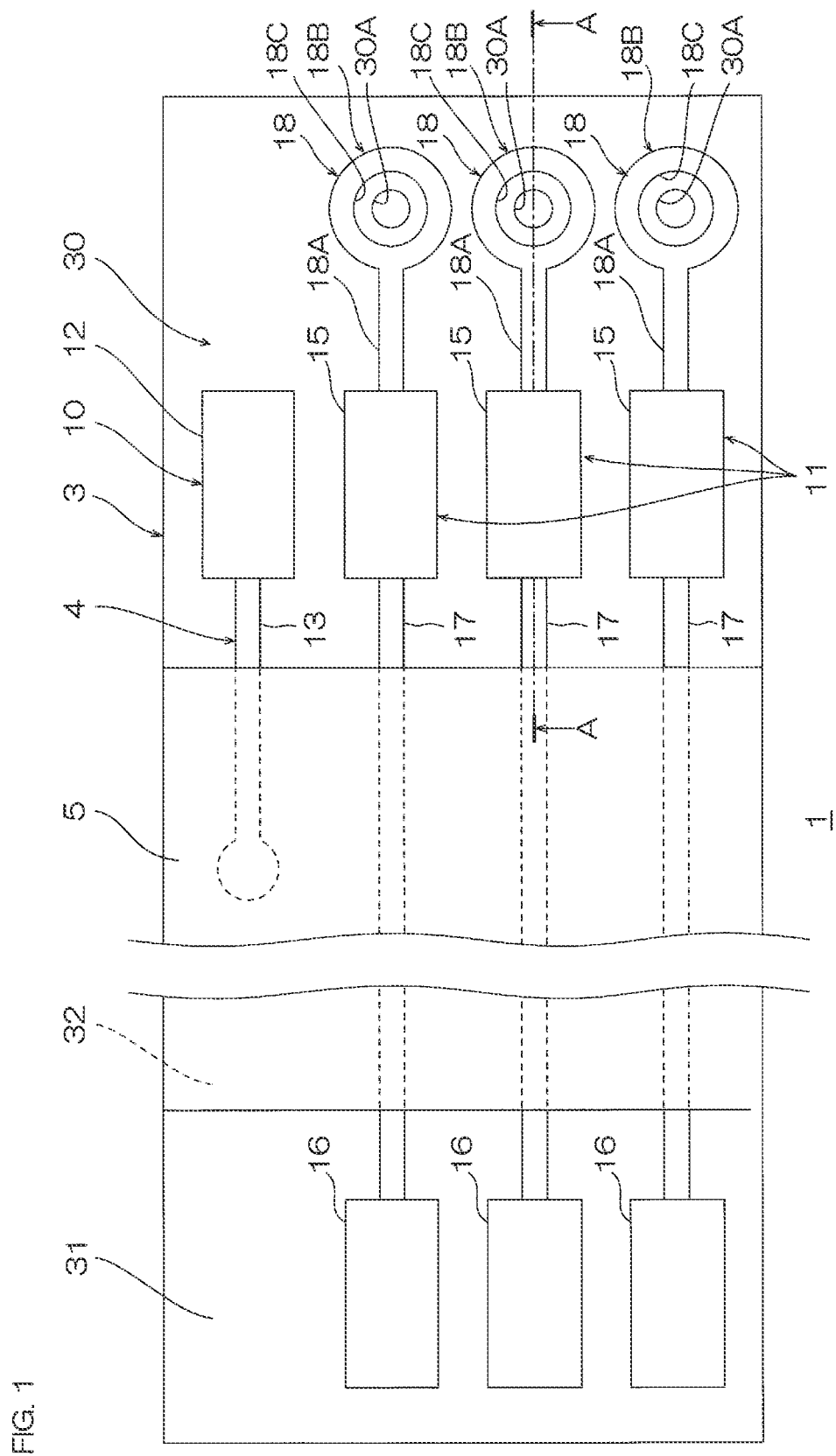
FIG. 1 shows a plan view of a first embodiment of a wiring circuit board of the present invention.
Figure 2:
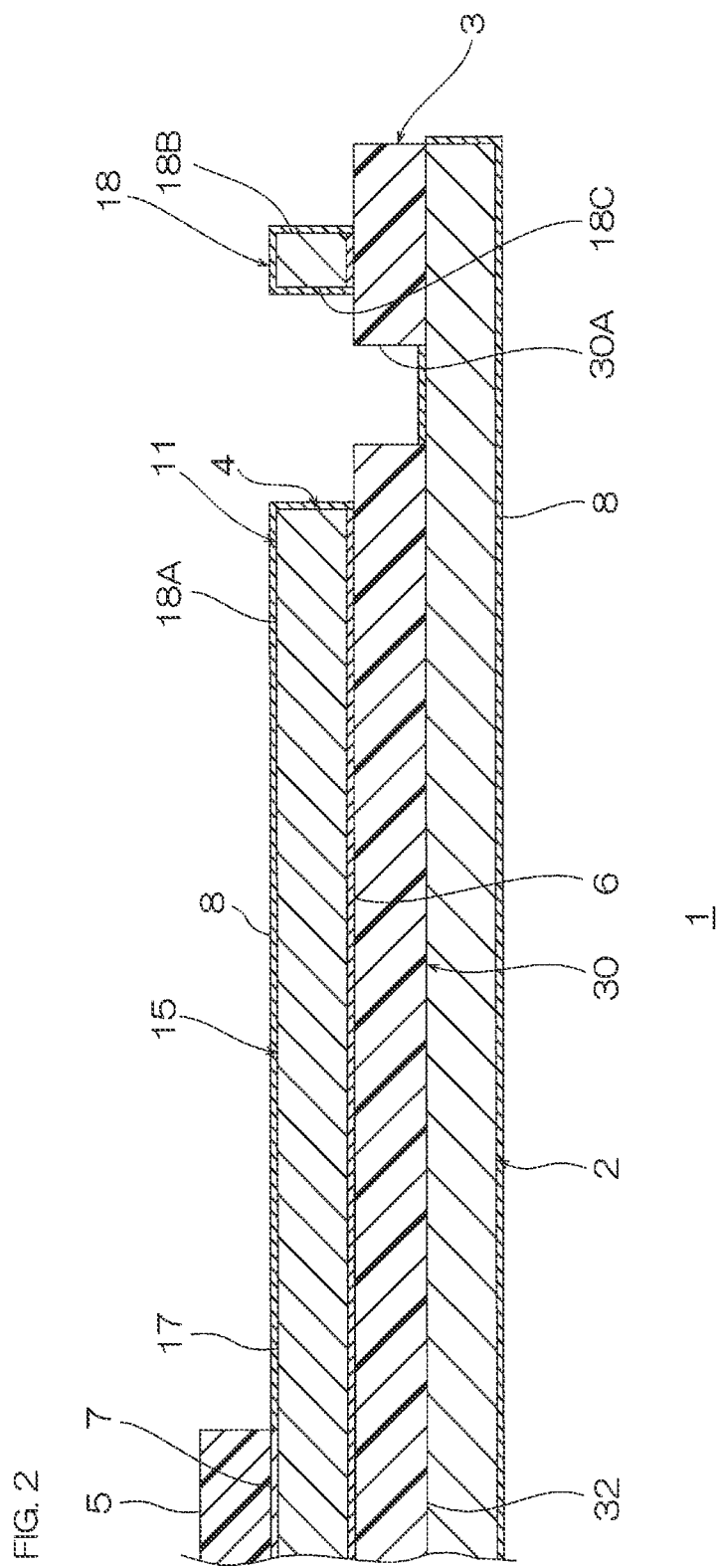
FIG. 2 shows an A-A cross-sectional view of the wiring circuit board shown in FIG. 1.

As shown in FIGS. 1 and 2, the wiring circuit board 1 has a sheet shape having a thickness. The wiring circuit board 1 has, for example, a rectangular shape in a plan view. Examples of the wiring circuit board 1 include a flexible printed wiring board with a reinforcing layer including a metal support layer 2 as a reinforcing layer, and a suspension board with a circuit including the metal support layer 2 as a suspension (spring) layer.

Specifically, as shown in FIG. 2, the wiring circuit board 1 includes the metal support layer 2, a base insulating layer 3 as one example of an insulating layer, a seed film 6, a conductive layer 4, a first plating layer 7, a cover insulating layer 5, and a second plating layer 8.

The metal support layer 2 has a flat plate shape. The metal support layer 2 has the same outer shape as the wiring circuit board 1. A thickness of the metal support layer 2 is not particularly limited.

A material for the metal support layer 2 can be, for example, appropriately selected from a known or conventional metal-based material (specifically, a metal material). Specifically, examples of the metal-based material include metal elements classified in the group 1 to group 16 in the periodic table, and alloys containing two or more metal elements. The metal element may be any of a transition metal and a typical metal.

More specifically, examples of the metal element include the group 2 metal element such as calcium, the group 4 metal element such as titanium and zirconium, the group 5 metal element such as vanadium, the group 6 metal element such as chromium, molybdenum, and tungsten, the group 7 metal element such as manganese, the group 8 metal element such as iron, the group 9 metal element such as cobalt, the group 10 metal element such as nickel and platinum, the group 11 metal element such as copper, silver, and gold, the group 12 metal element such as zinc, the group 13 metal element such as aluminum and gallium, and the group 14 metal element such as germanium and tin.

These metal-based materials may be used alone or in combination of two or more. Of the metal-based materials, preferably, an alloy containing two or more metal elements is used, more preferably, an alloy which can be etched simultaneously with the conductive layer 4 is used, particularly preferably, an alloy containing stainless steel and copper is used.

The base insulating layer 3 is disposed on one side in a thickness direction of the metal support layer 2, and specifically, on one surface in the thickness direction of the metal support layer 2. The base insulating layer 3 has a thickness, and has flat one surface and the flat other surface in the thickness direction.

As shown in FIG. 1, the base insulating layer 3 includes a first terminal disposed portion 30, a second terminal disposed portion 31, and a wiring disposed portion 32. The first terminal disposed portion 30 and the second terminal disposed portion 31 are located at spaced intervals to each other so as to sandwich the wiring disposed portion 32 therebetween. The first terminal disposed portion 30 is continuous with the wiring disposed portion 32.

The first terminal disposed portion 30 has a plurality of through holes 30A. That is, the base insulating layer 3 has the plurality of through holes 30A. The plurality of through holes 30A are located at spaced intervals to each other in a direction perpendicular to the thickness direction of the first terminal disposed portion 30. More specifically, the plurality of through holes 30A are located at spaced intervals to each other in a width direction of a first terminal 15 to be described later. The through hole 30A penetrates the first terminal disposed portion 30 in the thickness direction (ref. FIG. 2). The through hole 30A has a circular shape in a plan view.

The second terminal disposed portion 31 is located on the opposite side of the first terminal disposed portion 30 with respect to the wiring disposed portion 32. The second terminal disposed portion 31 is continuous with the wiring disposed portion 32. Each of the first terminal disposed portion 30 and the second terminal disposed portion 31 is not covered with the cover insulating layer 5, and is exposed from the cover insulating layer 5. The wiring disposed portion 32C is located between the first terminal disposed portion 30 and the second terminal disposed portion 31. The wiring disposed portion 32C is covered with the cover insulating layer 5.

Examples of a material for the base insulating layer 3 include resins (insulating resin materials) such as polyimide. A thickness of the base insulating layer 3 is not particularly limited, and is, for example, 1 µm or more, and 1000 µm or less.

As shown in FIG. 2, the seed film 6 is disposed on one surface in the thickness direction of the base insulating layer 3. The seed film 6 has a pattern corresponding to the conductive layer 4. Examples of a material for the seed film 6 include metals such as copper, chromium, and nickel, and alloys of these. The seed film 6 may be formed of one layer, or two or more layers. A thickness of the seed film 6 is, for example, 0.01 µm or more, and for example, 1 µm or less, preferably 0.1 µm or less.

The conductive layer 4 is disposed on one side in the thickness direction of the base insulating layer 3, and specifically, on one surface in the thickness direction of the seed film 6. As shown in FIG. 1, the conductive layer 4 includes a ground pattern 10 and a plurality of wiring patterns 11.

The ground pattern 10 includes a ground terminal 12 and a ground wiring 13.

The ground terminal 12 is disposed on one side in the thickness direction of the first terminal disposed portion 30. Specifically, the ground terminal 12 is disposed on one surface in the thickness direction of the first terminal disposed portion 30 via the seed film 6. The ground terminal 12 has a rectangular (square land) shape extending in a predetermined direction in a plan view.

The ground wiring 13 electrically connects the ground terminal 12 to the metal support layer 2. The ground wiring 13 is continuous from the ground terminal 12 to extend from the first terminal disposed portion 30 until the wiring disposed portion 32C. Specifically, the ground wiring 13 is disposed over one surface in the thickness direction of the first terminal disposed portion 30 and one surface in the thickness direction of the wiring disposed portion 32 via the seed film 6. The ground wiring 13 penetrates through the wiring disposed portion 32C in the thickness direction to be grounded to the metal support layer 2. A dimension in a width direction (direction perpendicular to a longitudinal direction) of the ground wiring 13 is smaller than that in the width direction (direction perpendicular to the longitudinal direction) of the ground terminal 12.

Each of the plurality of wiring patterns 11 includes the first terminal 15 as one example of a terminal portion, a second terminal 16, a connection wiring 17, and a ground lead residual portion 18. That is, the conductive layer 4 includes the plurality of first terminals 15, and the plurality of ground lead residual portions 18.

The first terminal 15 is disposed on one side in the thickness direction of the first terminal disposed portion 30.

Specifically, the first terminal 15 is disposed on one surface in the thickness direction of the first terminal disposed portion 30 via the seed film 6 (ref: FIG. 2). The first terminal 15 has a rectangular (square land) shape extending in a predetermined direction in a plan view. The first terminal 15 is located between the through hole 30A and the cover insulating layer 5 in the longitudinal direction of the first terminal 15. The plurality of first terminals 15 and the ground terminal 12 are disposed at spaced intervals to each other in the width direction (direction perpendicular to the longitudinal direction) of the first terminal 15.

The second terminal 16 is disposed on one side in the thickness direction of the second terminal disposed portion 31. Specifically, the second terminal 16 is disposed on one surface in the thickness direction of the second terminal disposed portion 31 via the seed film 6. The second terminal 16 has a rectangular (square land) shape extending in a predetermined direction in a plan view. The plurality of second terminals 16 are disposed at spaced intervals to each other in the width direction (direction perpendicular to the longitudinal direction) of the second terminal 16.

The connection wiring 17 electrically connects the first terminal 15 to the second terminal 16. The connection wiring 17 extends on the first terminal disposed portion 30 continuously from the first terminal 15, then, passes over the wiring disposed portion 32C, and is connected to the second terminal 16 on the second terminal disposed portion 31. Specifically, the connection wiring 17 is disposed over one surface in the thickness direction of the first terminal disposed portion 30, one surface in the thickness direction of the wiring disposed portion 32, and one surface in the thickness direction of the second terminal disposed portion 31 via the seed film 6. A dimension in the width direction (direction perpendicular to the longitudinal direction) of the connection wiring 17 is smaller than that in the width direction (direction perpendicular to the longitudinal direction) of the first terminal 15.

Figure 5:
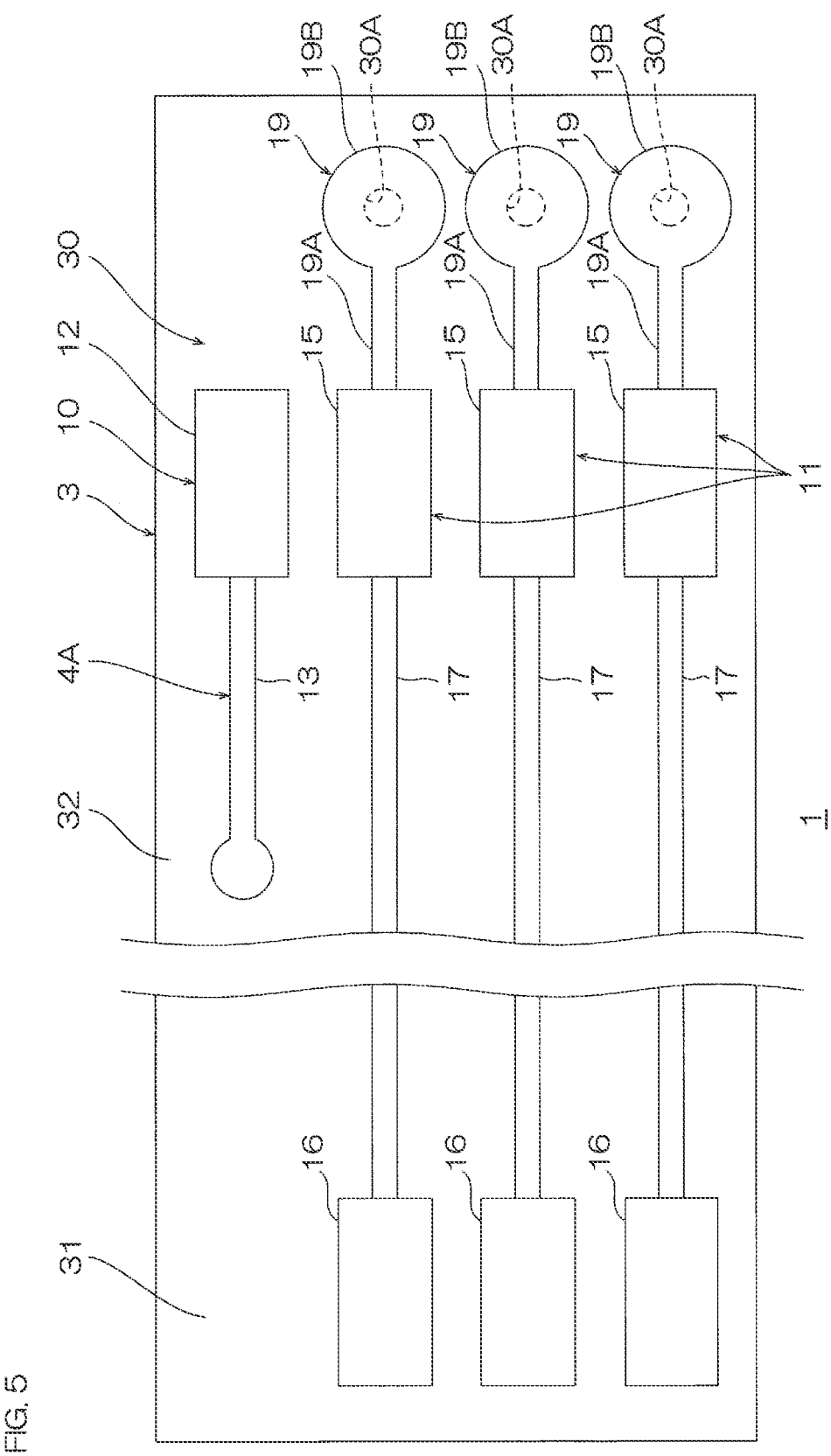
FIG. 5 shows a plan view of a conductive layer including a ground lead shown in FIG. 3D.

The ground lead residual portion 18 is a residual portion of a ground lead 19 obtained by removing a portion of the ground lead 19 in a method for producing the wiring circuit board 1 to be described later (ref: FIG. 5). The ground lead residual portion 18 is disposed on one side in the thickness direction of the first terminal disposed portion 30 (ref: FIG. 2). Specifically, the ground lead residual portion 18 is disposed on one surface in the thickness direction of the first terminal disposed portion 30 via the seed film 6. The ground lead residual portion 18 is electrically connected to the first terminal 15.

The ground lead residual portion 18 includes a first residual portion 18A and a second residual portion 18B. The first residual portion 18A connects the first terminal 15 to the second residual portion 18B. The first residual portion 18A extends continuously from the first terminal 15 to the opposite side of the connecting wiring 17. The second residual portion 18B is located on the opposite side of the first terminal 15 with respect to the first residual portion 18A. The second residual portion 18B has an opening 18C, and has a circular ring shape in a plan view. That is, the ground lead residual portion 18 has the opening 18C.

The opening 18C is continuous so as to surround the through hole 30A when viewed in the thickness direction. The opening 18C communicates with the through hole 30A in the thickness direction (ref: FIG. 2). The opening 18C has a circular shape in a plan view. An inner diameter of the opening 18C is larger than that of the through hole 30A. The center of the opening 18C and the center of the through hole 30A coincide with each other. That is, the opening 18C and the through hole 30A have a concentric circle when viewed in the thickness direction.

A thickness of the conductive layer 4 is, for example, 1 μm or more, and for example, 200 μm or less, preferably 100 μm or less.

In the present embodiment, the conductive layer 4 consists of one layer, and it is also possible to constitute the conductive layer 4 from a plurality of layers. For example, the first terminal 15 consists of a plurality of layers, and it is also possible to constitute the ground lead residual portion 18 from one layer.

Examples of a material for the conductive layer 4 include metal elements such as copper, silver, gold, iron, aluminum, and chromium, and metals such as alloys containing two or more metal elements, and preferably, a metal containing copper such as copper and copper alloy is used.

As shown in FIG. 2, the first plating layer 7 improves the adhesive properties between the conductive layer 4 and the cover insulating layer 5. The first plating layer 7 is an electroless plating layer, and located between the conductive layer 4 and the cover insulating layer 5. Specifically, the first plating layer 7 is provided so as to cover the surfaces of the ground wiring 13 and the connection wiring 17 located on the wiring disposed portion 32. Examples of a material for the first plating layer 7 include metal elements such as nickel, tin, silver, and palladium, and metals such as alloys containing two or more metal elements, and preferably, nickel is used. The first plating layer 7 may be formed of one layer, or two or more layers. A thickness of the first plating layer 7 is, for example, 0.01 μm or more, preferably 0.02 μm or more, and for example, 1 μm or less, preferably 0.5 μm or less.

The cover insulating layer 5 is disposed on one surface in the thickness direction of the wiring disposed portion 32 so as to cover the ground wiring 13 and the connection wiring 17. Further, the cover insulating layer 5 exposes the ground terminal 12, the plurality of first terminals 15, the plurality of ground lead residual portions 18, and the plurality of second terminals 16 (ref: FIG. 1). An example of a material for the cover insulating layer 5 includes the same material for the base insulating layer 3. A thickness of the cover insulating layer 5 is not particularly limited, and is, for example, 1 μm or more, and 1000 μm or less.

The second plating layer 8 is an electroless plating layer, and is provided so as to cover the surface of the conductive layer 4 exposed from the cover insulating layer 5 (specifically, the ground terminal 12, the plurality of first terminals 15, the plurality of ground lead residual portions 18, and the plurality of second terminals 16), and the surface of the metal support layer 2. Examples of a material for the second plating layer 8 include metal elements such as nickel and gold, and alloys containing the metal elements. The second plating layer 8 may be formed of one layer, or two or more layers. The second plating layer 8 may be, for example, formed by laminating a first layer containing nickel and a second layer containing gold. A thickness of the second plating layer 8 is, for example, 0.1 μm or more, preferably 0.25 μm or more, and for example, 5 μm or less, preferably 2.5 μm or less.

2. Producing Method of Wiring Circuit Board

Next, a method for producing the wiring circuit board 1 is described with reference to FIGS. 3A to 5.

Figure 3A:
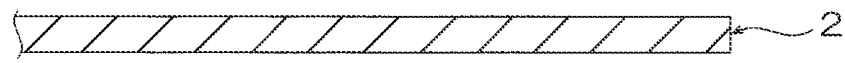
FIGS. 3A to 3E show production process views of the wiring circuit board shown in FIG. 2.
Figure 3B:
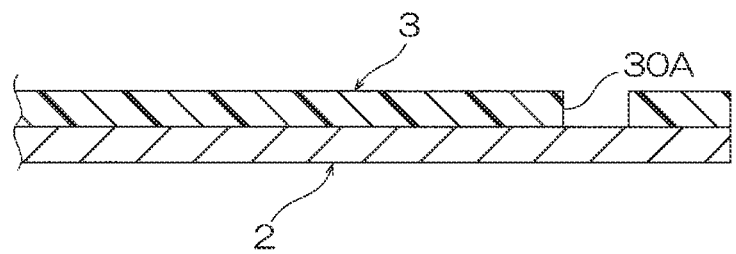
Figure 3C:
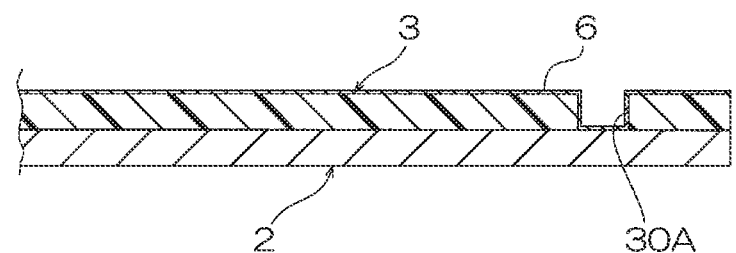
Figure 3D:
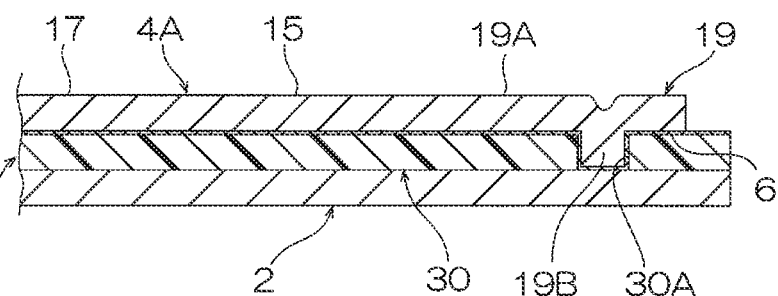
Figure 3E:
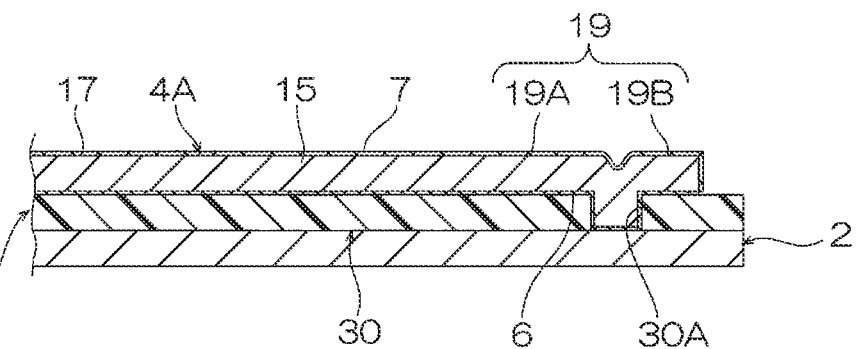

A method for producing the wiring circuit board 1 includes a step of preparing the metal support layer 2 (ref: FIG. 3A), a step of forming the base insulating layer 3 (ref: FIG. 3B), a step of forming the seed film 6 (ref: FIG. 3C), a step of forming a conductive layer 4A (ref: FIG. 3D), a step of removing the seed film 6 exposed from the conductive layer 4A (ref: FIG. 3E), a step of forming the first plating layer 7 (ref: FIG. 3E), a step of forming the cover insulating layer 5 (ref: FIG. 4F), a step of removing the first plating layer 7 exposed from the cover insulating layer 5 (ref: FIG. 4G), a step of forming the ground lead residual portion 18 (ref: FIG. 4H), a step of removing the seed film 6 exposed by the formation of the ground lead residual portion 18 (ref: FIG. 4I), and a step of forming the second plating layer 8 (ref: FIG. 4J).

As shown in FIG. 3A, first, the metal support layer 2 is prepared.

Then, as shown in FIG. 3B, the base insulating layer 3 having the through hole 30A is formed on one side in the thickness direction of the metal support layer 2. Specifically, a varnish containing the above-described resin is applied to one surface in the thickness direction of the metal support layer 2 and dried to form a base film. Thereafter, the base film is exposed to light via a photomask which is not shown to be developed, and cured by heating as necessary to form the base insulating layer 3 into the above-described pattern.

Then, as shown in FIG. 3C, the seed film 6 is formed on one surface in the thickness direction of the base insulating layer 3, and on one surface in the thickness direction of the metal support layer 2 exposed from the base insulating layer 3. Examples of a method for forming the seed film 6 include sputtering, electrolytic plating, and electroless plating, and preferably, sputtering is used.

Then, as shown in FIG. 3D, the conductive layer 4A is formed on one surface in the thickness direction of the seed film 6. As shown in FIG. 5, the conductive layer 4A has the same configuration as that of the conductive layer 4, except that the plurality of ground leads 19 are provided instead of the plurality of ground lead residual portions 18. In the following, the conductive layer 4A including the ground lead 19 is distinguished from the conductive layer 4 including the ground lead residual portion 18 as a pre-conductive layer 4A.

The ground lead 19 electrically connects the first terminal 15 to a portion of the metal support layer 2 exposed from the through hole 30A. The ground lead 19 includes a first portion 19A and a second portion 19B.

The first portion 19A is located on one side in the thickness direction of the first terminal disposed portion 30, and in particular, disposed on one surface in the thickness direction of the first terminal disposed portion 30 via the seed film 6 (ref: FIG. 3D). The first portion 19A is continuous with the first terminal 15. The second portion 19B electrically connects the first portion 19A to the metal support layer 2 via the through hole 30A. The second portion 19B is continuous with the first portion 19A, and located on one side in the thickness direction of the metal support layer 2 inside the through hole 30A. Specifically, the second portion 19B fills the through hole 30A, and is in contact with one surface in the thickness direction of the metal support layer 2 via the seed film 6 (ref: FIG. 3E).

To form the pre-conductive layer 4A, though not shown, a resist having a reversed pattern of the pre-conductive layer 4A is disposed on the seed film 6 to be subjected to, for example, electrolytic plating (preferably, electrolytic copper plating). Thereafter, the resist is removed.

Thus, the pre-conductive layer 4A including the first terminal 15 and the ground lead 19 is formed.

Then, as shown in FIG. 3E, the seed film 6 exposed from the pre-conductive layer 4A is removed by known etching (for example, wet etching and the like). Examples of an etching solution of the seed film 6 include a caustic soda aqueous solution, a potassium permanganate solution, and a sodium metasilicate solution.

Then, the pre-conductive layer 4A is subjected to electroless plating using a first electroless plating solution containing metal ions (for example, nickel ions) of the material for the first plating layer 7 described above.

Thus, the first plating layer 7 is formed so as to cover the exposed pre-conductive layer 4A (the ground terminal 12, the ground wiring 13, the first terminal 15, the second terminal 16, the connection wiring 17, and the ground lead 19).

Next, as shown in FIG. 4F, the cover insulating layer 5 is formed on one side in the thickness direction of the base insulating layer 3, specifically, on one surface in the thickness direction of the wiring disposed portion 32 so as to cover the ground wiring 13 and the connection wiring 17. The cover insulating layer 5 is formed into the above-described pattern.

Specifically, a varnish containing the above-described resin is applied to one surface in the thickness direction of the base insulating layer 3 and dried to form a cover film. Thereafter, the cover film is exposed to light via a photomask which is not shown to be developed, and cured by heating as necessary to form the cover insulating layer 5 into the above-described pattern.

Then, as shown in FIG. 4C the first plating layer 7 exposed from the cover insulating layer 5 is removed by known etching (for example, wet etching and the like). Examples of an etching solution of the first plating layer 7 include sulfuric acid and hydrogen peroxide, and pernitric acid water.

Next, as shown in FIG. 4H, a central portion of the second portion 19B is removed by etching so that the first terminal 15 is insulated from the metal support layer 2. Specifically, the central portion the second portion 19B is removed by wet etching so that the above-described opening 18C is formed. An example of an etching solution includes a ferric chloride solution.

Thus, the ground lead residual portion 18 having the opening 18C is formed. The opening 18C is continuously formed so as to surround the through hole 30A, and communicates with the through hole 30A. The opening 18C also exposes the seed film 6 located inside the opening 18C.

At this time, at the same time with the etching of the ground lead 19, it is possible to etch a portion of the metal support layer 2. The etching of the metal support layer 2 may be carried out separately from the etching of the ground lead 19.

Next, as shown in FIG. 4I, the seed film 6 exposed by the removal of the ground lead 19 is removed. Specifically, the seed film 6 located inside the opening 18C is removed by known etching (for example, wet etching and the like). Thus, the opening 18C exposes a portion of the metal support layer 2 through the through hole 30A.

Then, as shown in FIG. 4J, the conductive layer 4 exposed from the cover insulating layer 5 (specifically, the ground terminal 12, the first terminal 15, the ground lead residual portion 18, and the second terminal 16) and the metal support layer 2 are subjected to electroless plating using a second electroless plating solution containing the metal ions of the material for the second plating layer 8 described above. When the second plating layer 8 is formed of a plurality of layers, the electroless plating is repeated. For example, after the electroless plating using the second electroless plating solution containing the first metal ions (for example, nickel ions), the electroless plating is carried out using the second electroless plating solution containing the second metal ions (for example, gold ions).

Thus, the second plating layer 8 is formed so as to cover the exposed conductive layer 4 (specifically, the ground terminal 12, the first terminal 15, the ground lead residual portion 18, and the second terminal 16) and the metal support layer 2.

Thus, the wiring circuit board 1 is produced.

The application of the wiring circuit board 1 is not particularly limited, and the wiring circuit board 1 is used in various fields. The wiring circuit board 1 is, for example, used for various applications such as a wiring circuit board for an electronic device (wiring circuit board for an electronic component) and a wiring circuit board for an electric device (wiring circuit board for an electric component). Examples of the wiring circuit board for an electronic device and the wiring circuit board for an electric device include a wiring circuit board for a sensor used for sensors such as a position information sensor, an obstacle detection sensor, and a temperature sensor; a wiring circuit board for a transport vehicle used for transport vehicles such as an automobile, a train, an aircraft, and a working vehicle; a wiring circuit board for a video device used for video devices such as a flat panel display, a flexible display, and a projection video device; a wiring circuit board for a communication relay device used for communication relay devices such as a network device and a large communication device; a wiring circuit board for an information processing terminal used for information processing terminals such as a computer, a tablet, a smartphone, and a video game; a wiring circuit board for a movable device used for movable devices such as a drone and a robot; a wiring circuit board for medical equipment used for medical equipments such as wearable medical equipment and medical diagnostic equipment; a wiring circuit board for an electric device used for electric devices such as a refrigerator, a washing machine, a vacuum cleaner, and an air conditioning machine; and a wiring circuit board for a recording electronic device used for recording electronic devices such as a digital camera and a DVD recording device.

As shown in FIG. 1, the ground lead residual portion 18 is formed by removing a portion of the ground lead 19 for electrically connecting the first terminal 15 to the metal support layer 2 in the production of the wiring circuit board 1 (ref: FIG. 4G). Therefore, before removing the ground lead 19, since the first terminal 15 is electrically connected to the metal support layer 2, it is possible to uniformly form the first plating layer 7 on the conductive layer 4.

Further, the ground lead residual portion 18 has the opening 18C continuous so as to surround the through hole 30A in the base insulating layer 3. Therefore, it is possible to insulate the ground lead residual portion 18 from the metal support layer 2 without forming an opening in the metal support layer 2, and it is possible to suppress a decrease in the strength of the wiring circuit board 1.

As a result, since it is possible to dispose the ground lead residual portion 18 without considering a decrease in the strength of the wiring circuit board 1, it is possible to improve a degree of freedom of arrangement of the ground lead residual portion 18.

Further, as shown in FIG. 2, the opening 18C in the ground lead residual portion 18 communicates with the through hole 30A in the base insulating layer 3. Therefore, it is possible to reliably insulate the ground lead residual portion 18 from the metal support layer 2.

Further, as shown in FIGS. 3B to 4H, after forming the base insulating layer 3 having the through hole 30A (ref: FIG. 3B), the pre-conductive layer 4A including the first terminal 15, and the ground lead 19 for electrically connecting the first terminal 15 to the metal support layer 2 is formed (ref: FIG. 3D), next, the pre-conductive layer 4A is subjected to electroless plating (ref: FIG. 3E), and next, a central portion of the second portion 19B is removed so as to insulate the first terminal 15 from the metal support layer 2 to form the ground lead residual portion 18 (ref: FIG. 4H).

That is, when the conductive layer 4 is subjected to electroless plating, since the ground lead 19 electrically connects the first terminal 15 to the metal support layer 2, it is possible to form a uniform electroless plating layer on the pre-conductive layer 4A.

Further, since the ground lead residual portion 18 formed by removing the central portion of the second portion 19B has the opening 18C continuous so as to surround the through hole 30A, it is possible to insulate the ground lead residual portion 18 from the metal support layer 2 without forming an opening in the metal support layer 2. Thus, it is possible to suppress a decrease in the strength of the wiring circuit board 1.

Further, as shown in FIG. 4H, the seed film 6 exposed by the removal of the ground lead 19 is removed. Therefore, it is possible to more reliably insulate the ground lead residual portion 18 from the metal support layer 2.

Second Embodiment

Next, a second embodiment of the wiring circuit board of the present invention is described with reference to FIG. 6. In the second embodiment, the same reference numerals are provided for members corresponding to each of those in the above-described first embodiment, and their detailed description is omitted.

In the above-described first embodiment, as shown in FIG. 2, the opening 18C communicates with the through hole 30A. However, the configuration of the ground lead residual portion is not limited to this.

Figure 6:
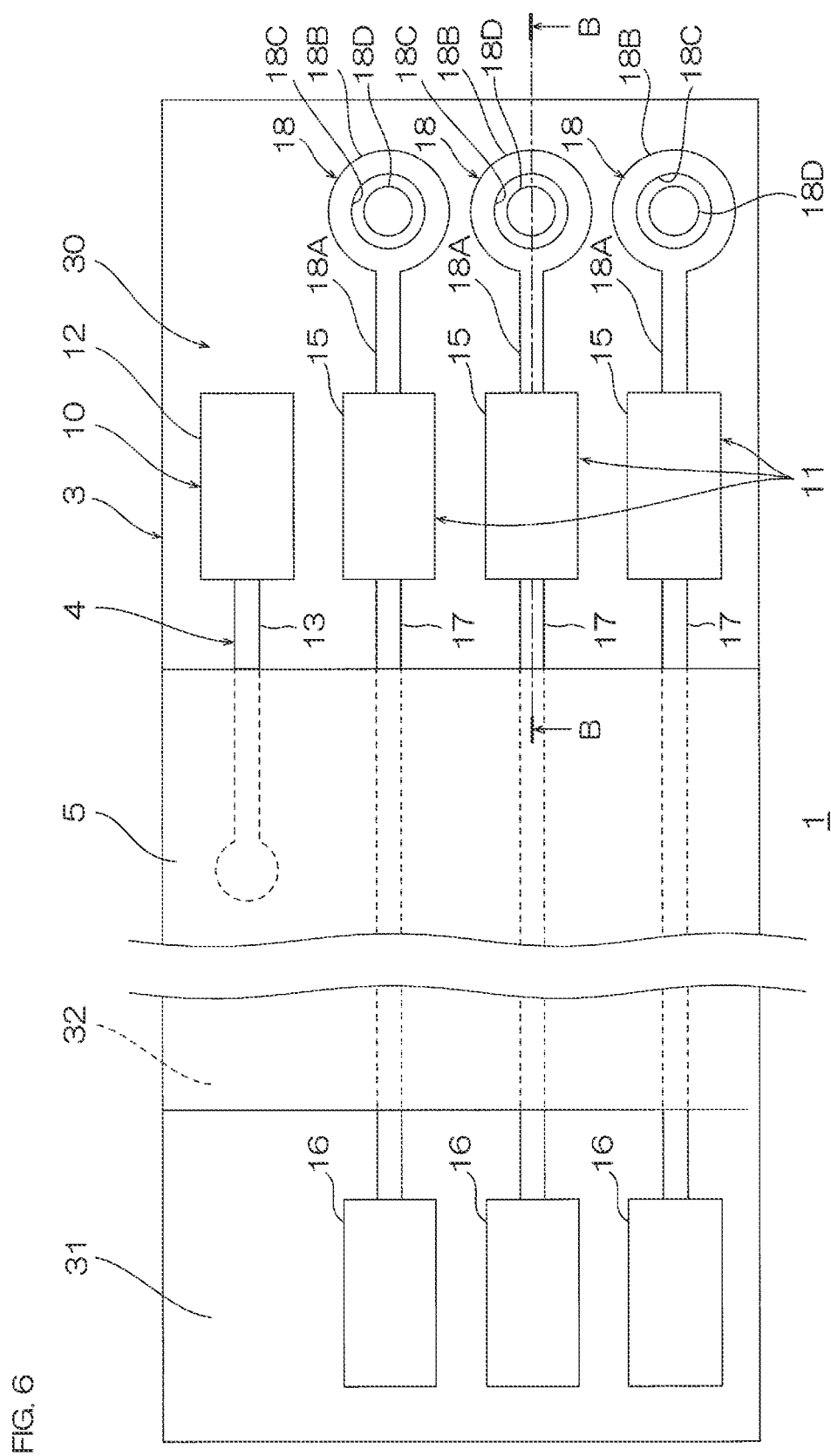
FIG. 6 shows a side cross-sectional view of a second embodiment of a wiring circuit board of the present invention.
Figure 7:
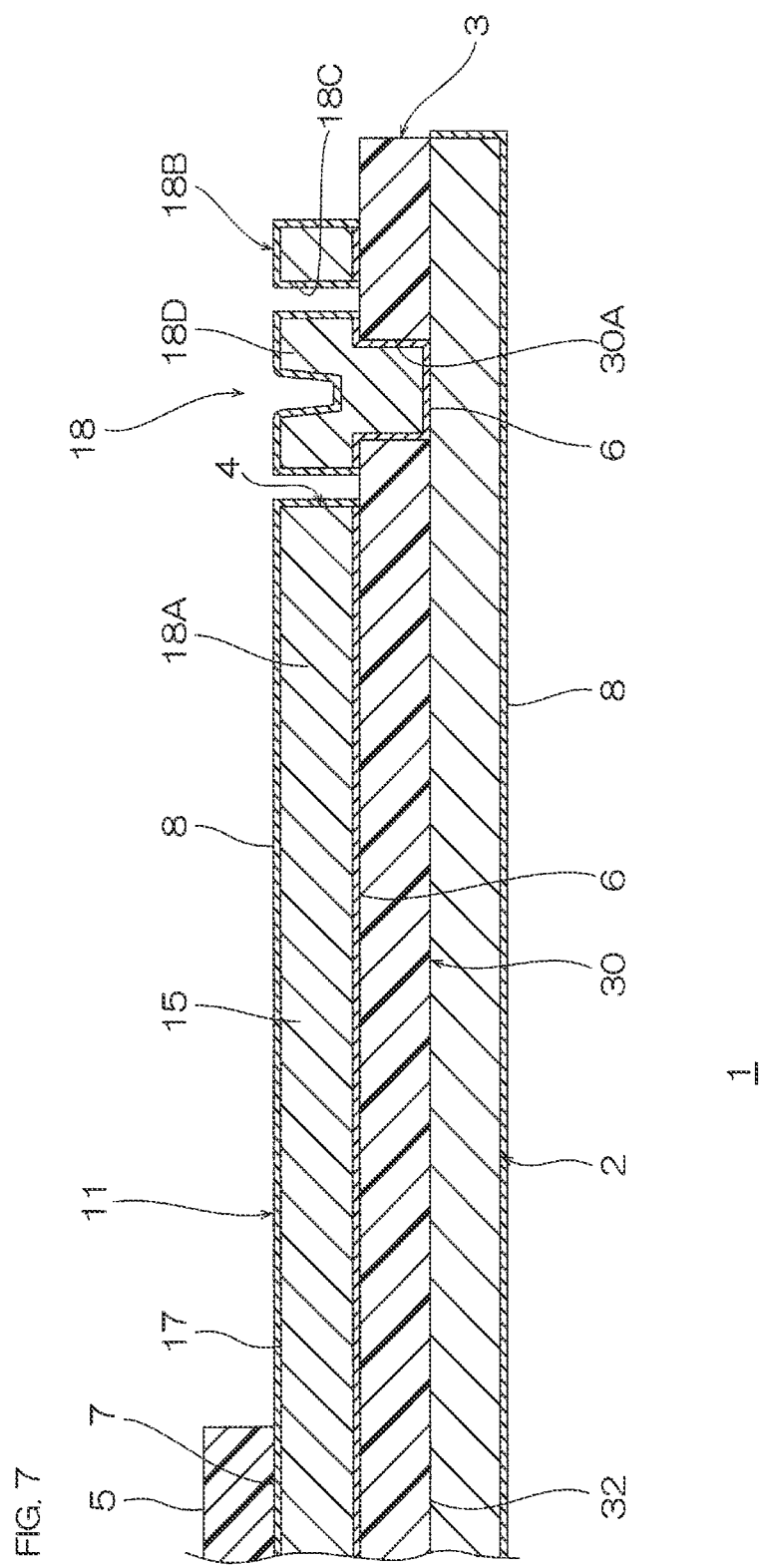
FIG. 7 shows a B-B cross-sectional view of the wiring circuit board shown in FIG. 6.

In the second embodiment, as shown in FIGS. 6 and 7, the ground lead residual portion 18 includes a third residual portion 18D as one example of a via portion in addition to the first residual portion 18A and the second residual portion 18B.

The third residual portion 18D is disposed in the opening 18C and fills the through hole 30A. Then, the third residual portion 18D is in contact with one surface in the thickness direction of the metal support layer 2 via the seed film 6. The third residual portion 18D has a circular shape when viewed in the thickness direction.

In this case, the second residual portion 18B is one example of a peripheral end portion. The second residual portion 18B defines the opening 18C, and is located at spaced intervals to the third residual portion 18D so as to surround the third residual portion 18D. The center of the opening 18C and the center of the third residual portion 18D coincide with each other. That is, the opening 18C and the third residual portion 18D have a concentric circle when viewed in the thickness direction.

To produce the wiring circuit board 1 of the second embodiment, in the same manner as in the first embodiment, the pre-conductive layer 4A is formed (ref: FIG. 3D), the pre-conductive layer 4A is subjected to electroless plating to form the first plating layer 7 (ref: FIG. 3E), then, the cover insulating layer 5 is formed (ref: FIG. 4F), next, the first plating layer 7 exposed from the cover insulating layer 5 is removed (ref: FIG. 4G), and thereafter, as shown in FIG. 6, a middle portion in a radial direction of the second portion 19B of the ground lead 19 is removed over the entire peripheral direction to form the second residual portion 18B and the third residual portion 18D. Thus, the ground lead residual portion 18 is formed, thereafter, as shown in FIG. 7, the seed film 6 exposed by the removal of the ground lead 21 is removed, and next, the second plating layer 8 is formed in the exposed conductive layer 4.

Thus, the wiring circuit board 1 of the second embodiment is produced.

In the second embodiment, the same function and effect as that of the above-described first embodiment can be achieved. On the other hand, in the second embodiment, a portion of the seed film 6 may remain between the second residual portion 18B and the third residual portion 18D. Therefore, from the viewpoint of ensuring the insulating properties between the first terminal 15 and the metal support layer 2, the first embodiment is more preferable than the second embodiment.

Third Embodiment

Next, a third embodiment of the wiring circuit board of the present invention is described with reference to FIG. 8. In the third embodiment, the same reference numerals are provided for members corresponding to each of those in the above-described first embodiment, and their detailed description is omitted.

In the above-described first embodiment, as shown in FIG. 1, the ground lead residual portion 18 is disposed on the opposite side of the connection wiring 17 with respect to the first terminal 15. However, the arrangement of the ground lead residual portion is not limited to this. In particular, since it is possible to freely dispose the ground lead residual portion without considering a decrease in the strength of the wiring circuit board 1, it is possible to dispose it at an inner-side portion of the wiring circuit board 1.

Figure 8:
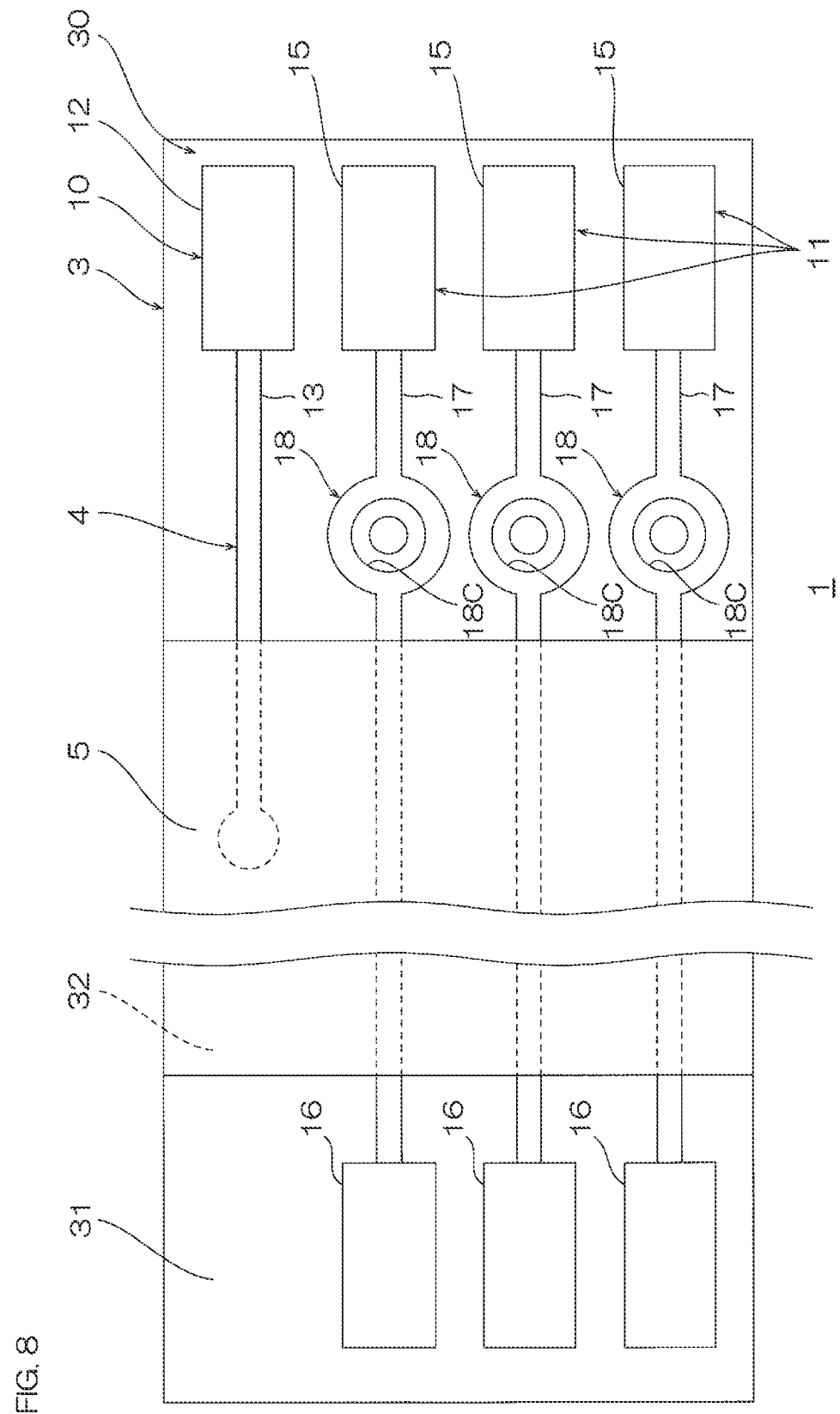
FIG. 8 shows a plan view of a third embodiment of a wiring circuit board of the present invention.

In the third embodiment, as shown in FIG. 8, the ground lead residual portion 18 is formed integrally with the connection wiring 17. In this case, the ground lead residual portion 18 is provided in the middle of the connection wiring 17 between the first terminal 15 and the second terminal 16.

In the third embodiment, the same function and effect as that of the above-described first embodiment can be achieved.

Modified Examples

In the above-described first to third embodiments, as shown in FIG. 3E, after the removal of the seed film 6 exposed from the pre-conductive layer 4A, as shown in FIG. 4G the seed film 6 exposed by the removal of the ground lead is removed. Alternatively, after the formation of the pre-conductive layer, the seed film may not be removed, and after the removal of the ground lead, the seed film exposed from the conductive layer may be also collectively removed.

In the above-described first to third embodiments, as shown in FIGS. 4F and 4G after the removal of the first plating layer 7 exposed from the cover insulating layer 5, a portion of the ground lead 19 is removed. However, the order of the removal of the first plating layer and the removal of the ground lead is not limited to this. After the removal of a portion of the ground lead, the first plating layer exposed from the cover insulating layer may be also removed.

In the above-described first to third embodiments, as shown in FIG. 4J, the second plating layer 8 is formed by electroless plating. However, a method for forming the second plating layer is not limited to this. For example, after the removal of the first plating layer and before the removal of a portion of the ground lead, it is also possible to form the second plating layer by electrolytic plating by using the ground lead as a plating lead (ref. FIG. 4G).

In addition, in the above-described first to third embodiments, after the formation of the seed film, the conductive layer is formed by an additive method of forming a conductive layer on a seed film. However, a method for forming the conductive layer is not limited to this. The conductive layer may be also formed by a subtractive method.

The modified examples can achieve the same function and effect as that of the above-described first embodiment. Further, the first to the third embodiments and the modified examples can be appropriately used in combination.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICATION

The wiring circuit board of the present invention is, for example, used for various applications such as a wiring circuit board for an electronic device (wiring circuit board for an electronic component), and a wiring circuit board for an electric device (wiring circuit board for an electric component).

DESCRIPTION OF REFERENCE NUMERALS

1 Wiring circuit board
2 Metal support layer
3 Base insulating layer
4 Conductive layer
4A Pre-conductive layer
6 Seed film
15 First terminal
18 Ground lead residual portion
18A First residual portion
18B Second residual portion
18C Opening
18D Third residual portion
19 Ground lead
30A Through hole

The invention claimed is:

1. A wiring circuit board comprising:
    a metal support layer,
    an insulating layer disposed on one side in a thickness direction of the metal support layer, and
    a conductive layer disposed on one side in the thickness direction of the insulating layer,
    wherein the conductive layer includes:
        a ground pattern including a ground terminal and being electrically connected to the metal support layer,
        a wiring pattern including a terminal portion and being insulated from the metal support layer,
        a ground lead residual portion being electrically connected to the terminal portion of the wiring pattern and being not connected to the ground pattern, and being insulated from the metal support layer,
    wherein the insulating layer has a through hole penetrating in the thickness direction, and
    wherein the ground lead residual portion has an opening continuous so as to surround the through hole.

2. The wiring circuit board according to claim 1, wherein the opening communicates with the through hole.

3. A wiring circuit board, comprising:
a metal support layer,
an insulating layer disposed on one side in a thickness direction of the metal support layer, and
a conductive layer disposed on one side in the thickness direction of the insulating layer, and including a terminal portion and a ground lead residual portion electrically connected to the terminal portion,
wherein the insulating layer has a through hole penetrating in the thickness direction,
wherein the ground lead residual portion has an opening continuous so as to surround the through hole, and
wherein the ground lead residual portion includes:
- a via portion disposed in the opening and filling the through hole, and
- a peripheral end portion defining the opening and located at spaced intervals to the via portion.

* * * * *